United States Patent
Verdiell

(10) Patent No.: US 7,019,907 B2
(45) Date of Patent: Mar. 28, 2006

(54) INTEGRATED LITHIUM NIOBATE BASED OPTICAL TRANSMITTER

(75) Inventor: Jean-Marc Verdiell, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 10/722,222

(22) Filed: Nov. 25, 2003

(65) Prior Publication Data

US 2005/0111773 A1   May 26, 2005

(51) Int. Cl.
*G02B 26/00* (2006.01)
*G02B 27/00* (2006.01)

(52) U.S. Cl. .............. 359/619; 359/237; 359/238; 359/245

(58) Field of Classification Search .............. 359/619, 359/237, 238, 240, 245, 246, 248, 247
See application file for complete search history.

(56) References Cited

U.S. PATENT DOCUMENTS 5,859,945 A * 1/1999 Kato et al. ................ 385/89

2005/0111779 A1 * 5/2005 Joyner et al. ............. 385/14

OTHER PUBLICATIONS

Breer et al., "Wavelength Demultiplexing with Volume Phase Holograms in Photorefractive Lithium Niobate," Appl. Phys. B 66, 339-345 (1998).
Song, "DWDM and the Future Integrated Services Networks," IEEE Canadian Review—Spring/Printemps 2000.
Kim et al., "Bidirectional Wavelength Add-Drop Multiplexer Using Multiport Optical Circulators and Fiber Bragg Gratings," IEEE Photonics Technology Letters, vol. 12, No. 5, May 2000.

* cited by examiner

*Primary Examiner*—Timothy Thompson
(74) *Attorney, Agent, or Firm*—Marshall, Gerstein & Borun LLP

(57) ABSTRACT

An integrated multi-channel transmitter for fiber optic applications is disclosed. The transmitter includes a laser array coupled to a modulator chip by way of an isolator sandwiched between two lenslet arrays. The modulator chip includes an array of modulators, with each one receiving the output of one of the lasers. The chip also includes a coupler that receives the outputs from the modulators and combines them into a single, combined output signal which, in turn, may be coupled an output fiber.

45 Claims, 1 Drawing Sheet

INTEGRATED LITHIUM NIOBATE BASED OPTICAL TRANSMITTER

TECHNICAL FIELD

An improved optical transmitter is disclosed. More specifically, an optical transmitter is disclosed with an integrated design whereby a lithium niobate chip is provided with a plurality of interferometers disposed therein that are in alignment with an output of a stacked laser array. The lithium niobate chip also includes a coupler or multiplexer for combining the plurality of output signals from the laser array into a single combined output signal.

BACKGROUND OF THE RELATED ART

Fiber optic transmission uses the same basic elements as copper-based transmission systems. Specifically, both systems utilize transmitters and receivers and a medium by which a signal is passed from the transmitter to the receiver. Instead of a copper wire, optic transmission systems use an optical fiber.

Typically, a fiber optic transmitter uses a laser diode or other light emitting device (LED) to optically encode information and generate an optical output at various light wavelengths, e.g., 850 nm, 1310 nm, 1550 nm etc. The optical fiber connects the transmitter to a receiver which then converts the optical signal to an electrical signal. The optical fiber may be either single-mode or multi-mode. Typical receivers incorporate optoelectronic transducers such as photodiodes to convert the optical signal to an electrical signal. A data recovery circuit then converts the data back into its original electrical form.

In order to increase transmission rates, wavelength division multiplexing (WDM) was developed for sending several different signals through a single fiber at different wavelengths. WDM components allow these separate signals to be joined into a composite output signal for transmission and then separated back into their original signals at the receiver end. Coarse wavelength division multiplexing (CWDM) is typically used up to 16 channels and dense wavelength division multiplexing (DWDM) allow up to several hundreds of signals to be combined into a single fiber. DWDM allow a multiple wavelength transmission in the C-Band (1550 nm) and more recently in the S-Band and L-Band as well. CWDM schemes have been used in many wavelength bands including near 850 nm, 1300 nm and all bands at 1500 nm.

However, despite the ability to transmit multiple signals over a single optical fiber, the transmitters of each signal continue to be single wavelength devices. Specifically, a typical transmitter includes a laser diode or other light emitting device coupled to a modulator which then outputs the modulated signal either directly or indirectly to the optical fiber. Typically, an isolator and various lens arrangements are disposed between the laser diode and the modulator. Also, a tap photodiode may also be included to measure the outputted signal.

The use of separate transmitters for each signal increases the size and complexity of the wavelength division multiplexing apparatus. Not only does the use of separate components for each signal add to the manufacturing time and cost, the incorporation of additional components into any optical transmission system further increases the possibility of defective products because of the precise alignment that is required between each component. Thus, reducing the number of components not only reduces the size and cost of each assembly, reducing the number of components also increases manufacturing efficiency.

As a result, there is a need for improved optical transmitter designs which are capable of transmitting multiple signals at multiple wavelengths and which reduce the total number of components needed to perform such a wavelength division multiplexing transmission.

BRIEF DESCRIPTION OF THE DRAWINGS

The disclosed apparatuses and methods will be described more or less diagrammatically in the accompanying drawing, wherein.

DETAILED DESCRIPTION OF THE PRESENTLY PREFERRED EMBODIMENTS

Figure 1:
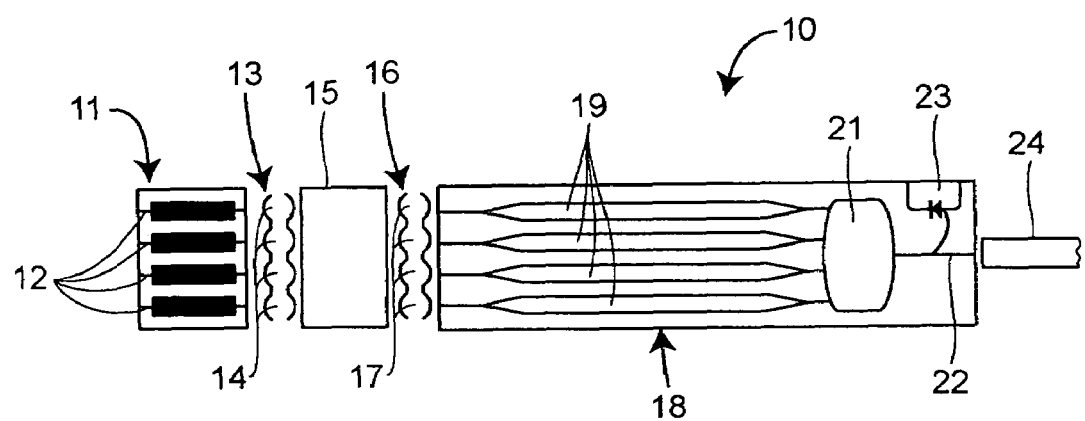
FIG. 1 is a schematic illustration of a four wavelength integrated transmitter made in accordance with this disclosure.

A schematic illustration of an integrated four wavelength transmitter 10 made in accordance with this disclosure is provided in FIG. 1. It will be noted that while the transmitter 10 illustrated in FIG. 1 includes four separate light sources and four separate modulators, the apparatus illustrated in FIG. 10 could be expanded to more or less than four wavelengths. This disclosure is clearly not limited to a four wavelength device.

As shown in FIG. 1, an array 11 of lasers 12 is provided. The lasers 12 may be distributed feedback (DFB) lasers with each having a fixed wavelength, or the lasers 12 may be tunable lasers such as multisection distributed brag reflector (DBR) lasers. Preferably, each laser 12 generates light of a different international telecom union (ITU) wavelength. Again, more or less than four lasers 12 may be provided.

The laser array 11 is coupled to a lenslet array 13 which, in the embodiment shown in FIG. 1, includes four lenses 14, that are aligned with the four lasers 12. In other words, the lenslet array 13 provides a single lens 14 for each laser 12, and the number of lenses 14 preferably corresponds to the number of lasers 12. Thus, in the example shown in FIG. 1, a 4×1 lenslet array 13 is preferred.

The lenslet array 13 is disposed between the laser array 11 and an optical isolator 15. The isolator 15 acts to block out unwanted back reflection of light into the laser diodes. Typically, the isolator 15 will include a crystal Faraday rotator disposed within a permanent magnet and that is sandwiched between a polarizer and an analyzer (not shown) as is known to those skilled in the art.

The output signals from the lasers 12 then exit the isolator 15 and pass through a second lenslet array 16 which, again, includes a plurality of lenses 17, each lens 17 corresponding to an output signal from one of the lasers 12. The lenslet array 16 is disposed between the isolator 15 and a lithium niobate ($LiNbO_3$) based chip 18.

The chip 18 includes a plurality of modulators 19 in a stacked configuration so that each modulator 19 is in alignment with the output from one of the lasers 12, after the output is passed through the arrays 13, 16 and isolator 15. In an embodiment, the modulators 19 are interferometers. Preferably, the modulators 19 are Mach-Zehnder interferometers (MZIs) as shown below in FIG. 2. The modulators apply modulation to each output signal for purposes of turning on and off the data/stream or applying other forms of modulation to the carrier wavelength such as phase modulation. The MZIs 19 typically perform this function at a speed of about 10 Gb/s.

The output from each modulator 19 is then inputted to a coupler or multiplexer 21. The coupler or multiplexer 21 functions to combine the separate output signals into a single combined output signal shown at 22. The coupler 21 may also be a cascade of splitters or couplers or a multi-mode interference coupler (MMI) as shown in FIG. 1. The coupler 21 is also incorporated into the lithium niobate chip 18. A tap photodiode 23 may also be incorporated into the lithium niobate chip 18 for purposes of monitoring the combined output signal 22. The combined output signal 22 may then be directed at a optical fiber 24 which, then, may be coupled to a receiver (not shown).

Figure 2:
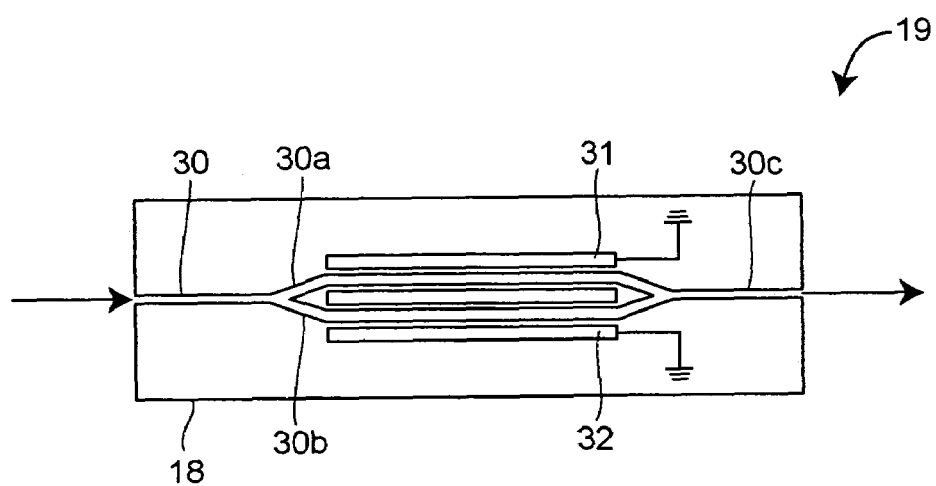
FIG. 2 is a schematic illustration of one of the Mach-Zehnder interferometers of the transmitter shown in FIG. 1.

A Mach-Zehnder interferometer 19 is illustrated in greater detail in FIG. 2. Within the lithium niobate chip 18, a waveguide 30 is formed having two divergent paths 30*a*, 30*b* as shown. Modulating voltage is applied to the waveguide 30 by way of the electrodes 31, 32. The modulating voltage causes a variation of the relative phase differences between the two paths 30*a*, 30*b*. At the output waveguide 30*c*, the two waves recombine as the sum of the two modes—the fundamental mode which is guided and a higher-order mode which is unguided and radiated away. As the path 30, 30*b* difference varies, the proportion of power in each mode changes and the guided output power is modulated.

By providing an array of modulators within a single lithium niobate chip 18, in combination with an array 11 of lasers, in combination with the lenslet arrays 13, 16 and isolator 15, the number of components has been reduced significantly. Specifically, for the four wavelength embodiment illustrated in FIG. 1, previously, four different transmitters would have been required. However, the design as disclosed herein enables an array of wavelengths to be handled by a signal transmitter. Again, the number of wavelengths in the array may be more or less than four.

Although lithium niobate (LiNbO$_3$) is the preferred material of construction for the chip 18, other suitable materials include, but are not limited to, InP, GaAs and various polymers that will be apparent to those skilled in the art.

Although a certain apparatus constructed in accordance with the teachings of this disclosure has been described herein, the scope of coverage of this patent is not limited thereto. In the contrary, this patent covers all embodiments of the teachings of this disclosure fairly falling within the scope of the appended claims, either literally or under the doctrine of equivalents.

What is claimed is:

1. An integrated multi-channel transmitter for fiber optic applications, the transmitter comprising:
a stacked array of lasers, the stacked array of lasers being coupled to a first lenslet array, the first lenslet array comprising a plurality of lenses with each lens coupled to an output of one of said lasers, the first lenslet array being disposed between the stacked array of lasers and an optical isolator, the isolator being disposed between the first lenslet array and a second lenslet array, the second lenslet array comprising a plurality of lenses with each lens coupled to an output of one of said lasers, the second lenslet array being disposed between the isolator and a chip comprising a plurality of modulators, each modulator coupled to the output of one of said lasers, the chip further comprising a coupler that receives the plurality of outputs from the modulators and combines them into a combined output signal.

2. The transmitter of claim 1 wherein the stacked array of lasers includes four lasers, the first and second lenslet arrays each include four lenses and the chip includes four modulators.

3. The transmitter of claim 1 wherein the modulators are Mach-Zehnder interferometers.

4. The transmitter of claim 1 wherein the coupler is a multi-mode interference coupler.

5. The transmitter of claim 1 wherein each of said modulators apply modulation to its respective laser output.

6. The transmitter of claim 1 wherein the chip further comprises a tap photodiode that measures the combined output signal.

7. The transmitter of claim 1 wherein the chip further comprises a plurality of tap photodiodes that measure outputs of each of said modulators.

8. The transmitter of claim 1 wherein each of said lasers is a distributed feedback laser.

9. The transmitter of claim 1 wherein each of said lasers is a tunable laser.

10. The transmitter of claim 1 wherein the chip is a lithium niobate chip.

11. The transmitter of claim 1 wherein the chip is made from a material consisting of LiNbO3, InP and GaAs.

12. The transmitter of claim 1 wherein the chip is a polymer chip.

13. A planar lightwave circuit comprising:
an integrated multi-channel transmitter for fiber optic applications, the transmitter comprising
a stacked array of at least four lasers,
the stacked array of lasers being coupled to a first lenslet array comprising an array of lenses with each lens aligned with an output of one of said lasers, the first lenslet array being disposed between the stacked array of lasers and an optical isolator,
the isolator being disposed between the first lenslet array and a second lenslet array, the second lenslet array comprising an array of lenses with each lens aligned with an output of one of said lasers after said outputs have passed through the first lenslet array and isolator, the second lenslet array being disposed between the isolator and a modulator chip,
the chip comprising an array of modulators with each modulator coupled to the output of one of said lasers after the output of each laser has passed through the lenslet arrays and the isolator, the chip further comprising a coupler that receives the at least four outputs from the modulators and multiplexes them into a combined output signal,
the chip being coupled to an optical fiber that receives the combined output signal.

14. The planar lightwave circuit of claim 13 wherein the modulators are Mach-Zehnder interferometers.

15. The planar lightwave circuit of claim 13 wherein the coupler is a multi-mode interference coupler.

16. The transmitter of claim 13 wherein the chip is a lithium niobate chip.

17. The transmitter of claim 13 wherein the chip is made from a material consisting of LiNbO3, InP and GaAs.

18. The planar lightwave circuit of claim 13 wherein the chip further comprises a tap photodiode that measures the combined output signal.

19. The planar lightwave circuit of claim 13 wherein the chip further comprises at least four tap photodiodes that measure outputs of each of said modulators.

20. The planar lightwave circuit of claim 13 wherein each of said lasers is a distributed feedback laser.

21. The planar lightwave circuit of claim 13 wherein each of said lasers is a tunable distributed Bragg reflector laser.

22. A method for integrating a multi-channel optical transmitter, the method comprising:
coupling a stacked array of at least four lasers a first lenslet array comprising an array of lenses so that each lens is aligned with an output of one of said lasers, coupling the first lenslet array to an isolator so that the first lenslet array is disposed between the stacked array of lasers and an optical isolator,
coupling the isolator to a second lenslet array comprising a plurality of lenses so that the isolator is disposed between the first and second lenslet arrays and so that the each lens of the second lenslet array is aligned with an output of one of said lasers after said outputs have passed through the first lenslet array and isolator,
coupling the second lenslet array to a chip comprising at least four modulators so that the second lenslet array is disposed between the isolator and the chip and so that each modulator is aligned with one of the outputs of one of said lasers after the output of each laser has passed through the lenslet arrays and the isolator, the chip further comprising a coupler that receives the at least four outputs from the modulators and multiplexes them into a combined output signal, and
coupling the chip to an optical fiber so the optical fiber is aligned with the combined output signal.

23. The method of claim 22 wherein the modulators are Mach-Zehnder interferometers.

24. The method of claim 22 wherein the coupler is a multi-mode interference coupler.

25. The method of claim 22 wherein and each of said lasers is one of a distributed feedback lasers or a tunable distributed Bragg reflector laser.

26. The method of claim 22 wherein the chip further comprises a tap photodiode that measures the combined output signal.

27. The method of claim 22 wherein the chip further comprises at least four tap photodiodes that measure outputs of each of said interferometers.

28. The method of claim 22 further comprising:
coupling the chip to an optical fiber so the optical fiber is aligned with the combined output signal.

29. A semiconductor chip comprising:
a plurality of stacked modulators, each modulator coupled to the output of one of an array of lasers, the chip further comprising a coupler that receives the plurality of outputs from the plurality of stacked modulators and combines them into a combined output signal, where the chip is coupled to the outputs of said lasers through a first lenslet array comprising a plurality of lenses with each lens coupled to an output of one of said lasers and a second lenslet array comprising a plurality of lenses with each lens coupled to an output of one of said lasers, the second lenslet array being disposed between the first lenslet array and the chip.

30. The chip of claim 29 wherein the modulators are Mach-Zehnder interferometers.

31. The chip of claim 29 wherein the coupler is a multi-mode interference coupler.

32. The chip of claim 29 wherein each of said modulators apply modulation to its respective laser output.

33. The chip of claim 29 wherein the chip further comprises a tap photodiode that measures the combined output signal.

34. The chip of claim 29 wherein the chip further comprises a plurality of tap photodiodes that measure outputs of each of said modulators.

35. The chip of claim 29 wherein the chip is made from a material consisting of LiNbO3, InP and GaAs.

36. The chip of claim 29 wherein the chip is a polymer chip.

37. A communications network comprising:
a wavelength division multiplexer comprising
an integrated multi-channel transmitter for fiber optic applications, the transmitter comprising
a stacked array of lasers, the stacked array of lasers being coupled to a first lenslet array,
the first lenslet array comprising a plurality of lenses with each lens coupled to an output of one of said lasers, the first lenslet array being disposed between the stacked array of lasers and an optical isolator,
the isolator being disposed between the first lenslet array and a second lenslet array,
the second lenslet array comprising a plurality of lenses with each lens coupled to an output of one of said lasers, the second lenslet array being disposed between the isolator and a chip comprising a plurality of modulators,
each modulator coupled to the output of one of said lasers, the chip further comprising a coupler that receives the plurality of outputs from the modulators and combines them into a combined output signal.

38. The network of claim 37 wherein the stacked array of lasers includes four lasers, the first and second lenslet arrays each include four lenses and the chip includes four modulators.

39. The network of claim 37 wherein the modulators are Mach-Zehnder interferometers.

40. The network of claim 37 wherein the coupler is a multi-mode interference coupler.

41. The network of claim 37 wherein each of said modulators apply modulation to its respective laser output.

42. The network of claim 37 wherein the chip further comprises a tap photodiode that measures the combined output signal.

43. The network of claim 37 wherein the chip further comprises a plurality of tap photodiodes that measure outputs of each of said modulators.

44. The network of claim 37 wherein the chip is made from a material consisting of LiNbO3, InP and GaAs.

45. The network of claim 37 wherein the chip is a polymer chip.

* * * * *